(12) United States Patent
Takechi

(10) Patent No.: US 7,736,997 B2
(45) Date of Patent: Jun. 15, 2010

(54) PRODUCTION METHOD OF FLEXIBLE ELECTRONIC DEVICE

(75) Inventor: Kazushige Takechi, Tokyo (JP)

(73) Assignee: NEC Corporation, Tokyo (JP)

( * ) Notice: Subject to any disclaimer, the term of this patent is extended or adjusted under 35 U.S.C. 154(b) by 230 days.

(21) Appl. No.: 11/077,156

(22) Filed: Mar. 11, 2005

(65) Prior Publication Data

US 2005/0151197 A1  Jul. 14, 2005

Related U.S. Application Data

(62) Division of application No. 10/751,631, filed on Jan. 6, 2004, now Pat. No. 7,271,415.

(30) Foreign Application Priority Data

Jan. 10, 2003  (JP)  ................ 4401/2003

(51) Int. Cl.
  *H01L 21/30*  (2006.01)
(52) U.S. Cl. ............ 438/459; 438/96; 438/365; 438/482; 438/149; 438/745; 257/E31.041; 257/E27.1; 257/E29.117; 257/E21.411; 257/E33.075; 257/E31.131; 257/E23.08; 257/E23.101; 257/675; 257/706; 257/712; 257/59; 257/72; 257/E21.228
(58) Field of Classification Search .......... 438/30, 438/149, 455, 459
See application file for complete search history.

(56) References Cited

U.S. PATENT DOCUMENTS

| | | | | |
|---|---|---|---|---|
| 5,442,470 A | * | 8/1995 | Hashimoto | 349/58 |
| 5,798,684 A | * | 8/1998 | Endo et al. | 338/22 R |
| 5,877,034 A | * | 3/1999 | Ramm et al. | 438/15 |
| 5,978,061 A | * | 11/1999 | Miyazaki et al. | 349/155 |
| 6,187,605 B1 | * | 2/2001 | Takasu et al. | 438/29 |
| 6,246,459 B1 | * | 6/2001 | Simhambhatla et al. | 349/149 |
| 6,307,751 B1 | * | 10/2001 | Bodony et al. | 361/749 |

(Continued)

FOREIGN PATENT DOCUMENTS

CN  1199507 A  11/1998

(Continued)

OTHER PUBLICATIONS

Asano, Akihiko and Kinoshita, Tomoatsu. "Low-Temperature Polycrystalline-Silicon TFT Color LCD Panel Made of Plastic Substrates." Society for Information Display 2002 International Symposium Digest of Technical Papers. May 2002: pp. 1196 to 1199.*

*Primary Examiner*—Minh-Loan T Tran
*Assistant Examiner*—Fei Fei Yeung Lopez
(74) *Attorney, Agent, or Firm*—Sughrue Mion, PLLC

(57) ABSTRACT

A flexible electronic device excellent in heat liberation characteristics and toughness and a production method for actualizing thereof in low cost and with satisfactory reproducibility are provided. A protection film is adhered onto the surface of a substrate on which surface a thin film device is formed. Successively, the substrate is soaked in an etching solution to be etched from the back surface thereof so as for the residual thickness of the substrate to fall within the range larger than 0 μm and not larger than 200 μm. Then, a flexible film is adhered onto the etched surface of the substrate, and thereafter the protection film is peeled to produce a flexible electronic device.

13 Claims, 10 Drawing Sheets

U.S. PATENT DOCUMENTS

| | | | |
|---|---|---|---|
| 6,372,608 B1 * | 4/2002 | Shimoda et al. | 438/455 |
| 6,468,438 B1 * | 10/2002 | Shin et al. | 216/84 |
| 6,476,446 B2 * | 11/2002 | Ju | 257/347 |
| 6,592,969 B1 | 7/2003 | Burroughes et al. | |
| 6,878,607 B2 * | 4/2005 | Inoue et al. | 438/458 |
| 2002/0030189 A1 * | 3/2002 | Ishikawa | 257/59 |
| 2002/0058577 A1 * | 5/2002 | Hayden et al. | 501/60 |
| 2002/0197771 A1 * | 12/2002 | Dotta et al. | 438/114 |
| 2003/0025118 A1 * | 2/2003 | Yamazaki et al. | 257/79 |
| 2003/0174275 A1 * | 9/2003 | Asano et al. | 349/187 |

FOREIGN PATENT DOCUMENTS

| | | |
|---|---|---|
| JP | 8-262418 A | 10/1996 |
| JP | 2722798 B2 | 11/1997 |
| JP | 9-312349 A | 12/1997 |
| JP | 11-212116 A | 8/1999 |
| JP | 11-329715 A | 11/1999 |
| JP | 2002-111222 A | 4/2002 |
| JP | 2002-111226 A | 4/2002 |
| JP | 2002-353369 A | 12/2002 |
| KR | 2002-0090917 A | 12/2002 |

* cited by examiner

PRODUCTION METHOD OF FLEXIBLE ELECTRONIC DEVICE

This application is a DIV of Ser. No. 10/751,631 filed on Jan. 6, 2004, now U.S. Pat. No. 7,271,415, the entire contents and disclosures of which are incorporated herein by reference.

BACKGROUND OF THE INVENTION

1. Field of the Invention

The present invention relates to a flexible electronic device and a production method of the same. In particular, the present invention relates to a method for producing a flexible silicon electronic device and a flexible liquid crystal display device.

2. Description of the Prior Art

In these years, demand has grown for IC cards provided with a built-in memory circuit and a microprocessor circuit, as they have larger storage capacity compared with magnetic cards. Usually these IC cards are often carried in wallets and the like, and the cards are frequently subjected to bending forces caused by the movements of the carriers. However, conventional IC chips, namely, semiconductor chips themselves formed with silicone wafer are not flexible, and moreover, are relatively fragile, and hence there is a high possibility that these chips will be damaged when external forces are exerted thereon. For the purpose of preventing the damage of such IC chips, for example, Japanese Patent Laid-Open No. 9-312349 (FIGS. 1 to 4, pp. 4 to 10) discloses a procedure in which a semiconductor IC chip formed on a silicon wafer is transferred to a flexible resin sheet. Additionally, Japanese Patent Laid-Open No. 2002-111222 (FIGS. 1 to 3, pp. 3 to 4) and Japanese Patent Laid-Open No. 2002-111226 (FIG. 1, p. 4) disclose multilayer composite boards in which IC chips having various functions are laminated and modules using these multilayer composite boards.

As described above, development of techniques have widely been promoted for actualizing flexible silicon devices and high-function system-in-packages by transferring integrated circuits (hereinafter referred to as IC's) formed by using silicon wafer to resin substrates.

Additionally, in these years, development has been promoted for flexible liquid crystal devices using resin substrates, as thin film transistor liquid crystal display devices are light in weight and resistant to fracture. As a procedure for actualizing the above mentioned devices, a technique has been developed in which a thin film transistor array once formed on a glass substrate is transferred onto a resin substrate. For example, glass substrate on which a thin film transistor array is formed is subjected to wet etching from the back surface of the glass substrate with the aid of a HF based solution to completely remove the glass substrate, and thereafter a resin substrate is adhered to the etched surface to form a flexible thin film transistor board (Akihiko Asano and Tomoatsu Kinoshita, Low-Temperature Polycrystalline-Silicon TFT Color LCD Panel Made of Plastic Substrates, Society for Information Display 2002 International Symposium Digest of Technical Papers, United States, May 2002, pp. 1196 to 1199). Description will be made below on this conventional process on the basis of FIGS. 1A to 1D. A protection sheet 24 is adhered onto the surface of a glass substrate 23 on which an etching stopper 21 and a thin film transistor array 22 are formed (FIG. 1A). Successively, a HF based solution is used to completely remove the glass substrate from the back surface of the glass substrate in such a way that the etching is terminated by the etching stopper 21 (FIG. 1B). A resin substrate 25 is adhered onto the etched surface (FIG. 1C). Finally, the protection sheet 24 is peeled to complete the transference (FIG. 1D). Alternatively, Japanese Patent Laid-Open No. 11-212116 discloses a method in which instead of wet etching, a chemical polishing method is used to completely remove a glass substrate and thereafter a thin film transistor array is transferred on to a resin substrate.

Furthermore, Japanese Patent No. 2722798 discloses a production method in which a liquid crystal display element formed with a pair of glass substrates is soaked in an etching solution to make the glass substrates thinner.

Among the above described conventional techniques, in Japanese Patent Laid-Open No. 9-312349, a step of peeling a semiconductor IC chip from a silicon wafer and a step of transferring onto a flexible resin sheet are low in yield to thereby raise the production cost. Additionally, the IC chip is of the order of a few tens μm in thickness and is not transparent so that the applicable areas thereof are limited and the element isolation of the active elements (for example, transistors) is complicated in such a way that mixed loading of high voltage elements and low voltage elements becomes difficult. The multilayer composite boards disclosed in Japanese Patent Laid-Open No. 2002-111222 and Japanese Patent Laid-Open No. 2002-111226 have semiconductor IC chips, formed of silicon wafer, mounted on resin substrates and thus raise the production costs. Additionally, it has become obvious that these semiconductor IC chips suffer from deterioration in characteristics caused by self-heating.

Furthermore, in the technique in which transferring is made onto a resin substrate after the glass portion has been completely removed from the back surface thereof by etching or polishing a glass substrate on which a thin film transistor array is formed, for the purpose of forming flexible liquid crystal display devices, the step of peeling the protection sheet, illustrated in FIG. 1D, requires a fairly long period of time for successfully transferring the thin film transistor array onto the resin substrate, and hence the throughput concerned is remarkably degraded. Additionally, the step of forming an etching stopper layer as a film is to be added, which raises the costs. Japanese Patent No. 2722798 takes as its object only the reduction of the glass substrate thickness, but does not contain a concept leading to production of flexible devices subsequent to the thickness reduction.

SUMMARY OF THE INVENTION

An object of the present invention is to provide flexible electronic devices such as flexible IC devices, flexible display devices and the like, excellent in heat liberation characteristics and toughness, and a method for producing these devices with low costs and high reproducibility.

A flexible electronic device of the present invention is a flexible electronic device in which on a flexible film, a substrate is situated which is different in material from the film, and a thin film device is formed on the substrate, wherein the thickness of the substrate is larger than 0 μm and not larger than 200 μm. As the flexible films of the flexible electronic devices of the present invention, there can be used insulating flexible films such as polyethylene terephthalate (PET) film, high thermal conductivity films having larger thermal conductivities than those of glasses, such as copper film and gold film and optically functional films such as polarizing films and phase difference films. As the flexible films, there can be used a film having a laminated structure composed of an insulating flexible film and a high thermal conductivity film. The use of the high thermal conductivity films such as copper film and gold film having larger thermal conductivities than those of glasses, as the flexible films for the flexible electronic devices of the present invention, permits suppressing the deterioration in characteristics of the thin film devices caused by self-heating.

Additionally, the production method of the flexible electronic devices of the present invention can produce a flexible electronic device as follows: a substrate on which an electronic device such as a thin film transistor array is formed is subjected to etching from the back surface (the substrate surface opposite to the surface for electronic device formation) until the residual thickness of the substrate becomes larger than 0 μm and not larger than 200 μm, and thereafter a flexible film is adhered onto the etched surface to produce a flexible electronic device. The production method of the flexible electronic device of the present invention can regulate the residual thickness of the substrate to a desired value with high reproducibility within the range larger than 0 μm and not larger than 200 μm.

The production method of the flexible electronic device of the present invention provides the following advantages.

(1) A protection film adhered to the device surface can be easily peeled so that the throughput is not degraded in contrast to the conventional techniques.

(2) No etching stopper layer is needed to be formed as a film although a stopper layer is necessary in the conventional techniques.

(3) No large warping occurs in the flexible device due to the internal stress in the thin films constituting the electronic device.

(4) The regulation of the etching residual thickness of the substrate to be larger than 0 μm and not larger than 200 μm permits flexible bending of the substrate.

(5) As a substrate, either an insulating substrate or a conductive substrate can be used. In particular, the use of a glass substrate permits actualizing flexible electronic devices such as flexible IC devices and flexible display devices comprising thin film transistors formed of amorphous silicon thin film and polycrystalline or single crystalline silicon thin films based on laser crystallization.

BRIEF DESCRIPTION OF THE DRAWINGS

This above-mentioned and other objects, features and advantages of this invention will become more apparent by reference to the following detailed description of the invention taken in conjunction with the accompanying drawings, wherein.

DETAILED DESCRIPTION OF THE PREFERRED EMBODIMENTS

Now, description will be made below on the present invention with reference to the accompanying drawings.

Figure 2A:
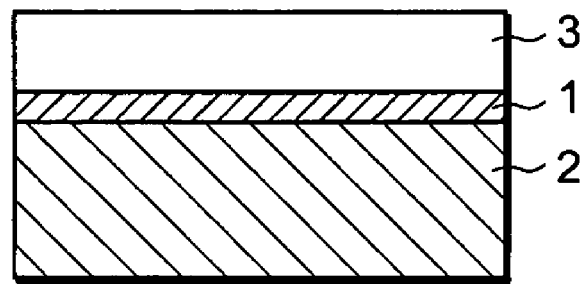
FIGS. 2A to 2D are the schematic sectional views illustrating a production method involved in a first embodiment of the present invention.
Figure 2B:
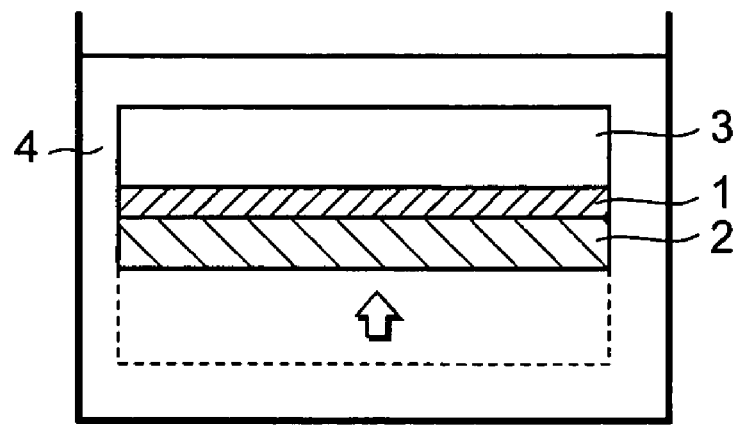
Figure 2C:
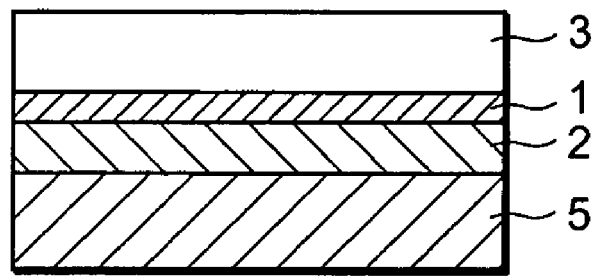
Figure 2D:
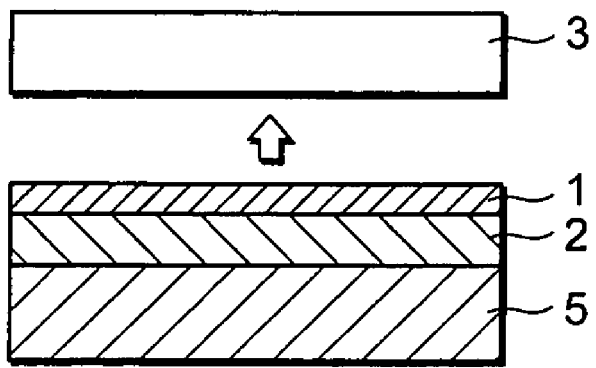

FIGS. 2A to 2D are the schematic sectional views illustrating a production method of a flexible electronic device involved in a first embodiment of the present invention. As FIG. 2A shows, a protection film 3 is adhered onto the device formation surface (the front surface) of a glass substrate 2 on which a thin film device 1 is formed. Successively, as FIG. 2B shows, the substrate 2 is subjected to etching from the back surface by soaking in an etching solution 4. On the basis of the etching rate determined beforehand, the etching is terminated when a desired residual thickness of the substrate is reached. Thus, the residual thickness is made to be larger than 0 μm and not larger than 200 μm. In this connection, it should be noted that if the residual thickness of the substrate 2 vanishes, the characteristics of the thin film device are degraded, and if the residual thickness is larger than 200 μm, no sufficient flexibility can be achieved. Furthermore, as FIG. 2C shows, a flexible film 5 is adhered onto the etched surface of the substrate 2. Finally, as FIG. 2D shows, the protection film 3 adhered on the front surface is peeled to complete the transference.

Figure 1A:
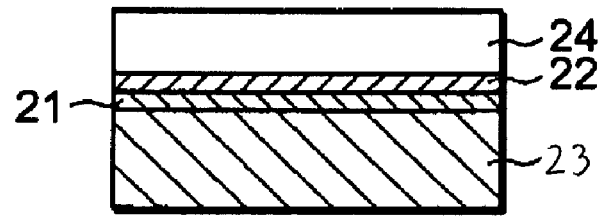
FIGS. 1A to 1D are the schematic sectional views illustrating an example of the conventional production methods.
Figure 1B:
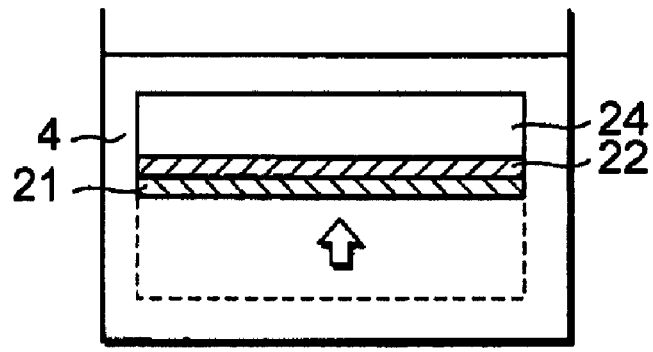
Figure 1C:
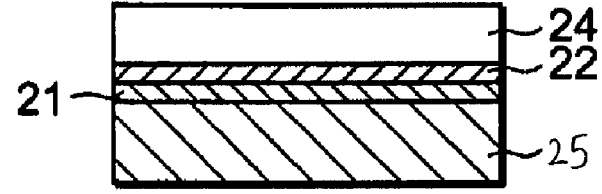
Figure 1D:
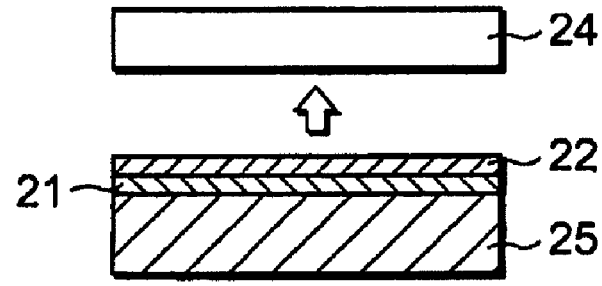

Description will be made below on an example of the first embodiment. As a thin film device 1 shown in FIG. 2A, a thin film transistor was formed on a glass substrate 2. By using a silicon thin film as an active layer formed by the laser annealing method or the solid phase growth method and a silicon oxide film as an insulating film formed by the vapor phase growth method or the like, p-channel and n-channel field effect thin film transistors were formed. The glass substrate 2 was made of a non-alkaline borosilicate glass which contained a trace of boron oxide and a trace of alumina. The thickness of the substrate 2 was 0.7 mm. A polyethylene film was adhered as the protection film 3 with the aid of an adhesive (not shown in the figure) onto the thin film transistor formation surface of the glass substrate 2. The thickness of the protection film 3 was made to be 200 μm or less in consideration of facilitating the subsequent peeling. The material for the protection film 3 is not limited to polyethylene, but can be any materials excellent in resistance to hydrofluoric acid such as polypropylene, polycarbonate, polyethylene terephthalate (PET), polyether sulfone (PES) and the like. By soaking the glass substrate 2 in a mixed solution of hydrofluoric acid and hydrochloric acid, the substrate 2 was subjected to etching from the back surface thereof. The addition of hydrochloric acid was effective in efficient etching of the boron oxide and alumina contained in the glass substrate 2. The etching rate of the glass substrate 2 determined beforehand in relation to the above described mixed solution was 5 μm/min, and accordingly an etching for 130 minutes reduced the substrate thickness from 0.7 mm down to 50 μm. Although the elevation of the temperature of the mixed solution could have further accelerated the etching rate of the glass substrate 2, a too fast etching rate might lead to poor reproducibility in regulating the residual thickness of the substrate so that the mixed solution temperature was set to be 70° C. or below. Thereafter, a 150 μm thick PET film was adhered onto the etched surface of the glass substrate 2 as the flexible film 5. In consideration of the flexibility, the thickness of the PET film is preferably of the order of 10 μm to 2 mm. Finally, the protection film 3 was peeled to complete the flexible thin film transistor device. The peeling of the protection film was conducted mechanically, and the peeling step duration was a few minutes. In view of the fact that a conventional process in which a glass substrate is completely removed for subsequent transferring (FIG. 1D) requires a few hours for the protection film peeling step, the transference process of the present invention allows a considerable reduction of the processing time. Alternatively, if a material capable of taking either a solid phase or a liquid phase depending on ambient temperature is used as an adhesive for the protection film 3, the peeling can be made easily in a further shorter time. For example, if an adhesive is used which is solid at 80° C. or below and liquid at 80° C. or above, when the atmospheric temperature is made to be 100° C. in the protection film peeling step, the adhesive becomes liquid so that the protection film can be peeled very easily in a short time. Additionally, the protection film is not necessarily needed to be a film, but may be a material which can form a film by coating with the aid of a solvent and by subsequent hardening based on baking.

Now, description will be made below on a second embodiment of the present invention.

Figure 3A:
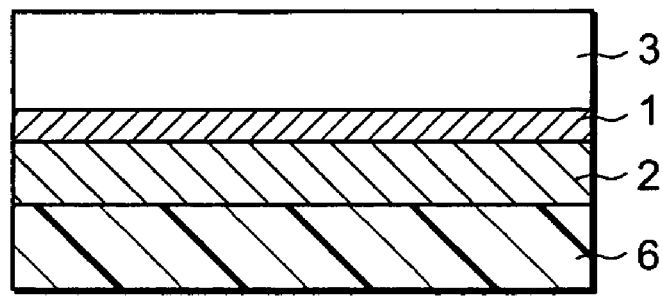
FIGS. 3A to 3B are the schematic sectional views illustrating a production method involved in a second embodiment of the present invention.
Figure 3B:
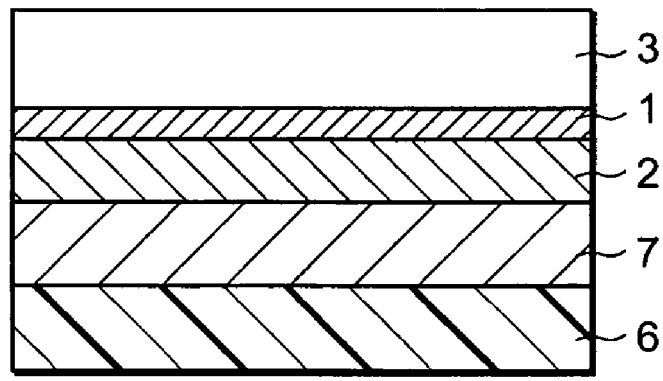

FIGS. 3A and 3B illustrate the second embodiment. FIG. 3A illustrates a case where in place of the flexible film 5 in FIG. 2C, a highly thermally conductive film 6 having a thermal conductivity higher than 0.01 W/cm·deg is used, while FIG. 3B illustrates a case where in place of the flexible film 5 in FIG. 2C, a laminated film made of an insulating flexible film 7 and the highly thermally conductive film 6 is used. The vertical order of the insulating flexible film 7 and the highly thermally conductive film 6 may be reversed. In this connection, the value of 0.01 W/cm·deg refers to a thermal conductivity of a glass, and the use of a film having a thermal conductivity higher than this value improves the heat liberation characteristics of a flexible thin film transistor device. As examples, a copper film (thermal conductivity=4.0 W/cm·deg) and a gold film (thermal conductivity=2.3 W/cm·deg) were used as the highly thermally conductive film 6. Examples using such devices include driver circuits and memory circuits for liquid crystal displays and printers. In particular, as for lengthy circuits, such circuits cannot be formed from conventional silicon wafers, and hence the present invention is effective.

Figure 4:
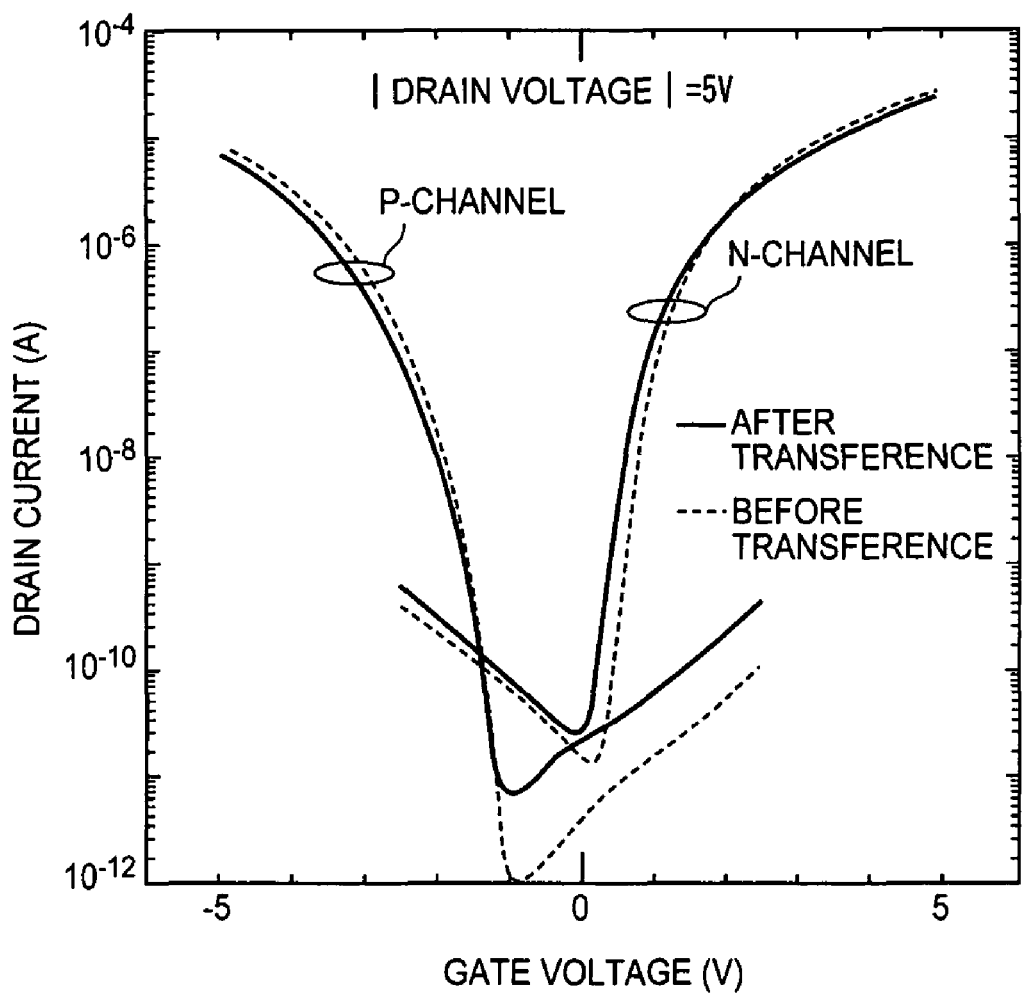
FIG. 4 is a graph showing the electric characteristics of a flexible substrate thin film transistor produced by the production method of the present invention.

FIG. 4 shows the gate voltage-drain current characteristics measured before and after transference for the thin film transistors (p-channel and n-channel) formed on flexible substrates with the aid of the transference method described in the above examples. At the time of the measurement, the absolute value of the drain voltage was 5 V. As can be seen from this figure, scarce differences are found between the characteristics before and after transference; thus, the use of the transference process of the present invention has succeeded in forming flexible substrate thin film transistors equivalent in characteristics to thin film transistors formed on glass substrates.

Now, description will be made below on a third embodiment of the present invention.

Figure 5A:
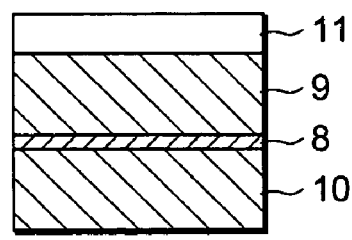
FIGS. 5A to 5E are the schematic sectional views illustrating a production method involved in a third embodiment of the present invention.
Figure 5B:
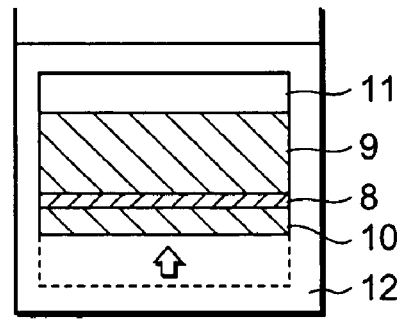
Figure 5C:
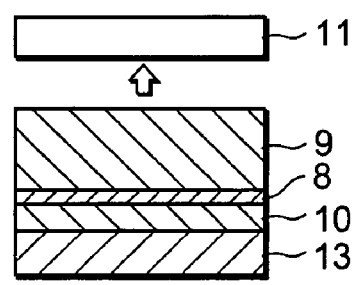
Figure 5D:
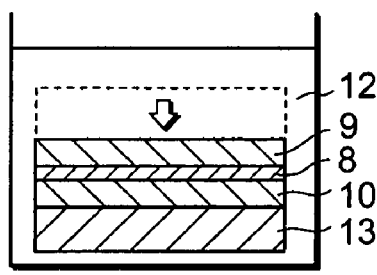
Figure 5E:
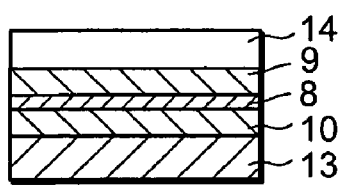

FIGS. 5A to 5E show a production method of a flexible display device involved in the third embodiment. As FIG. 5A shows, at the beginning, a protection film 11 is adhered onto a glass substrate 9 of a display device having a structure in which a display element 8 is sandwiched between a pair of a glass substrate 9 and a glass substrate 10. Successively, as FIG. 5B shows, the thus treated display device is soaked in a hydrofluoric acid based etching solution 12 to etch the glass substrate 10. On the basis of the etching rate determined beforehand for the glass substrate 10, the etching is terminated when the residual thickness of the glass substrate 10 reaches a desired value. The residual thickness of the glass substrate 10 is adjusted to be larger than 0 μm and not larger than 200 μm. Then, as FIG. 5C shows, a flexible film 13 is adhered onto the etched surface of the glass substrate 10, and the protection film 11 is peeled from the glass substrate 9. Then, as FIG. 5D shows, the thus treated display device is once again soaked in the hydrofluoric acid based etching solution 12 to etch the glass substrate 9. On the basis of the etching rate determined beforehand for the glass substrate 9, the etching is terminated when the residual thickness of the glass substrate 9 reaches a desired value, the residual thickness being adjusted to be larger than 0 μm and not larger than 200 μm. Finally, as FIG. 5E shows, a flexible film 14 is adhered onto the etched surface of the glass substrate 9 to complete a flexible display device.

Description will be made on an example of the third embodiment. A liquid crystal display device was produced as the display device shown in FIG. 5A. A thin film transistor array for driving pixels and the like were formed on the glass substrate 9, and a counter electrode was formed on the glass substrate 10 by use of a transparent conductive film. The thicknesses of the glass substrates 9 and 10 are both 0.7 mm. A liquid crystal was injected in the clearance between these glass substrates adhered together. Then, a polyethylene film was adhered onto the glass substrate 9 as a protection film 11. Examples of the material for the protection film 11 are not limited to polyethylene, but can include any materials excellent in the resistance to hydrofluoric acid such as polypropylene, polycarbonate, PET, PES and the like. The liquid crystal device was soaked in a mixed solution of hydrofluoric acid and hydrochloric acid to etch the glass substrate 10. The etching rate of the glass substrate 10 determined beforehand in relation to the mixed solution was 5 μm/min, and accordingly an etching for 130 minutes reduced the substrate thickness of the glass substrate 10 from 0.7 mm down to 50 μm. Then, a film having polarizing function was adhered as a flexible film 13 onto the etched surface of the glass substrate 10, and the polyethylene film as the protection film was peeled. The liquid crystal device thus treated was soaked once again in the mixed solution of hydrofluoric acid and hydrochloric acid to etch the glass substrate 9. The etching rate of the glass substrate 9 determined beforehand in relation to the mixed solution was 5 μm/min, and accordingly an etching for 130 minutes reduced the substrate thickness of the glass substrate 9 from 0.7 mm down to 50 μm. Finally, a film having polarizing function was adhered as a flexible film onto the etched surface of the glass substrate 9 to complete a flexible liquid crystal device. In the above described example, description is made on a case where a film having polarizing function was used as the flexible film; alternatively, transparent resin substrates such as PET substrates may be adhered onto the etched surfaces of the substrates to complete a flexible liquid crystal device as illustrated in FIG. 5E, and then polarizing films may be adhered onto the respective surfaces. Although a transmittance type liquid crystal display device is described in the above example, alternatively a reflection type flexible liquid crystal display device can be actualized in such a way that the film to be adhered onto the glass substrate 9 is restricted to a transparent resin substrate such as a PET substrate and a film to be adhered onto the glass substrate 10 is made to be a film having phase difference function and polarizing function.

Now, description will be made below on a fourth embodiment of the present invention.

Figure 6A:
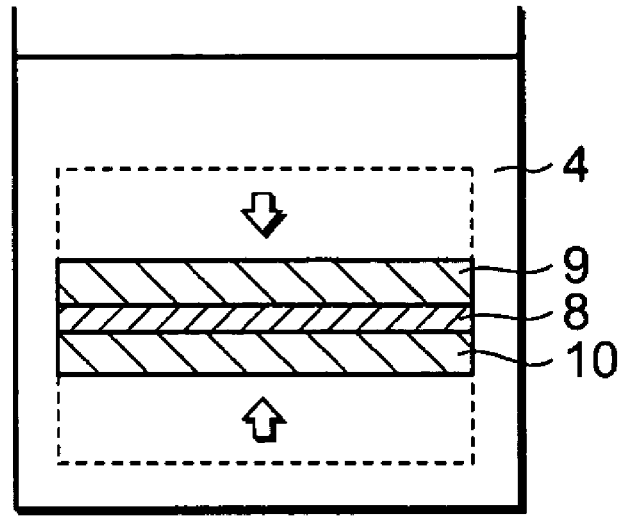
FIGS. 6A to 6C are the schematic sectional views illustrating a production method involved in a fourth embodiment of the present invention.
Figure 6B:
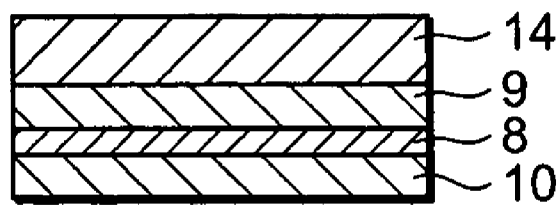
Figure 6C:
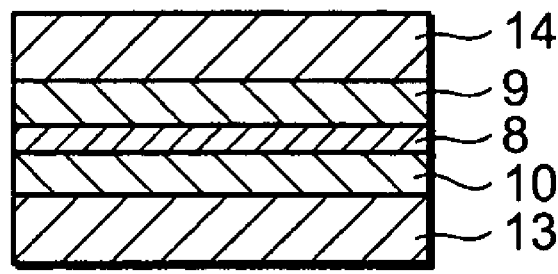

FIGS. 6A to 6C show a production method of a flexible display device involved in the fourth embodiment. Although FIG. 5 illustrates a case where a pair of glass substrates are separately subjected to etching, both substrates may be etched simultaneously as FIG. 6A shows. A display device constituted of the two sheets of glass substrates 9 and 10, as FIG. 6A shows, are soaked in a hydrofluoric acid based solution to etch the two sheets of glass substrate simultaneously. In this etching, it is preferable that the residual thickness of each of the glass substrates is larger than 0 μm and not larger than 200 μm. Successively, as FIG. 6B shows, a flexible film 14 is adhered onto the etched surface of the glass substrate 9. Furthermore, as FIG. 6C shows, a flexible film 13 is adhered onto the etched surface of the glass substrate 10. As described in the above examples, also in the present case, a polarizing film and a phase difference film both having optical functions can be used as the flexible films 13, 14.

For actual displaying by use of a liquid crystal device, the signals for driving the pixels need to be input from the outside. For that purpose, the display device needs to be mounted with a driver for driving pixels and a flexible circuit board and the like. As FIGS. 5 and 6 show, these items may be mounted after the flexible display device has been produced. Alternatively, these items may be mounted on the glass substrate beforehand before being subjected to processing, and then subjected to the processing as shown in FIGS. 5 and 6.

Figure 7A:
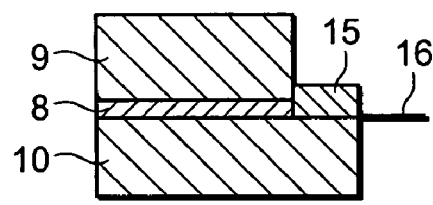
FIGS. 7A to 7E are the schematic sectional views illustrating the examples in the third and fourth embodiments of the present invention.
Figure 7B:
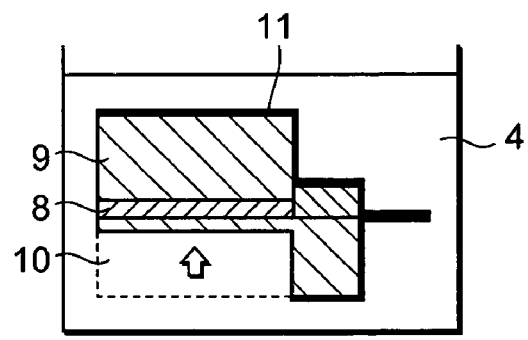
Figure 7C:
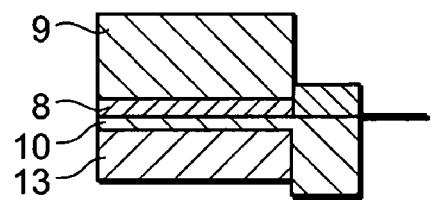
Figure 7D:
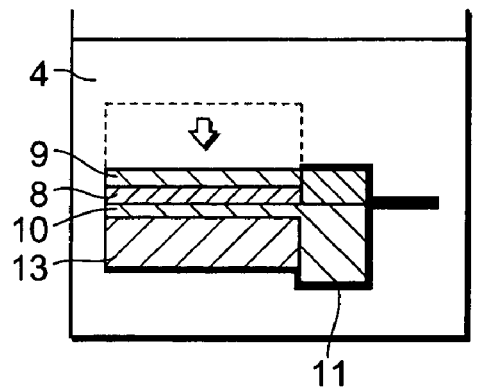
Figure 7E:
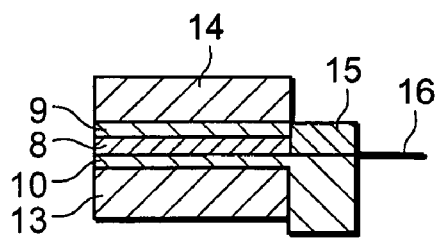

FIGS. 7A to 7D show an example in which the processing was conducted after the mounting was made. As FIG. 7A shows, a driver for driving pixels 15 and a flexible circuit board 16 were mounted on the surface of a glass substrate 10 exposed to a glass substrate 9 in a device having a structure in which a display element 8 is sandwiched between a pair of glass substrates 9 and 10. Thereafter, as FIG. 7B shows, a protection film 11 was adhered, and only the portions desired to be etched of the surface of the glass substrate 10 were exposed and subject to etching, and thereafter the protection film 11 was peeled. Then, as FIG. 7C shows, a flexible film 13 was adhered onto the etched surface of the glass substrate 10. Furthermore, as FIG. 7D shows, a protection film 11 was once again adhered onto the portions other than the glass substrate 9 to be etched, and then the glass substrate 9 was subjected to etching. Finally, as FIG. 7E shows, a flexible film 14 was adhered onto the etched surface of the glass substrate 9 for completion. Here, as the flexible films, a polarizing film and a phase difference film having optically functional films can be used. Also as in the case illustrated in FIG. 6, the glass substrates 9 and 10 may be etched simultaneously. In such a method as described above, no mounting is needed after etching processing, in contrast to the cases illustrated in FIGS. 5 and 6, and hence the damages such as fracture in the glass substrates occurring at the time of mounting can be prevented.

Now, description will be made below on a fifth embodiment of the present invention.

Figure 8A:
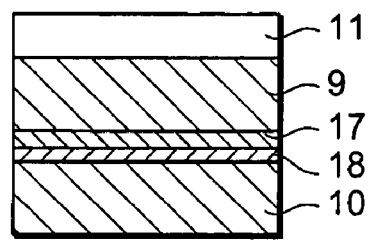
FIGS. 8A to 8E are the schematic sectional views illustrating a production method involved in a fifth embodiment of the present invention.
Figure 8B:
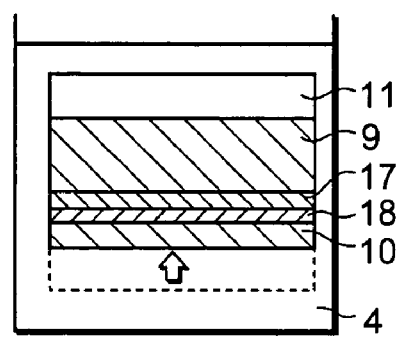
Figure 8C:
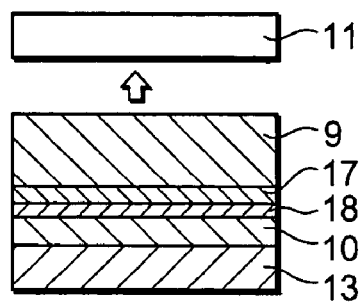
Figure 8D:
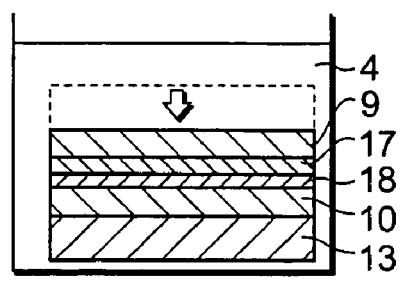
Figure 8E:
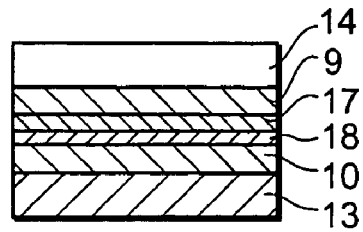

FIGS. 8A to 8E show a production method of a flexible electronic device involved in the fifth embodiment. Although FIG. 5 illustrates a case of a flexible display device, the fifth embodiment is a production method of an integrated device which is produced by forming a system through adhering together thin film devices formed on glass substrates. At the beginning, as FIG. 8A shows, a glass substrate 9 on which a thin film device 17 is formed and a glass substrate 10 on which a thin film device 18 is formed are adhered together to form a device, and a protection film 11 is adhered onto the glass substrate 9 of the device. Successively, as FIG. 8B shows, the device is soaked in a hydrofluoric acid based solution to etch the glass substrate 10. On the basis of the etching rate of the glass substrate 10 determined beforehand, the etching is terminated when a desired residual thickness was reached, the residual thickness being made to be larger than 0 μm and not larger than 200 μm. Furthermore, as FIG. 8C shows, a flexible film 13 is adhered onto the surface to be etched of the glass substrate 10, and then the protection film 11 is peeled. Then, as FIG. 8D shows, the device is once again soaked in the hydrofluoric acid based etching solution 12 to etch the glass substrate 9. On the basis of the etching rate of the glass substrate 9 determined beforehand, the etching is terminated when a desired residual thickness is reached, the residual thickness being made to be larger than 0 μm and not larger than 200 μm. Finally, as FIG. 8E shows, a flexible film 14 is adhered onto the etched surface of the glass substrate 9 to complete a flexible laminated integrated device. Also in this flexible integrated device, as FIG. 3 shows, as flexible films, high thermal conductivity films or laminated structure films composed of an insulating film and a high thermal conductivity film can be used.

As examples of the fifth embodiment, there can be cited driver circuits for liquid crystal displays and printers as the thin film devices 17 and memory circuits and the like as the thin film devices 18. For the driver circuits for use in these circuits, lengthy driver circuits are needed to be formed, but cannot be formed from conventional silicon wafer; thus, polysilicon thin film transistors and the like formed on glass substrates are used for that purpose. In this context, lamination of memory circuits permits downsizing the whole circuit areas. More specifically, lamination of circuits formed on glass substrates by the use of such a production method as described for the fifth embodiment and subsequent etching of the glass substrates and adhering of flexible films make it possible to actualize large area and lengthy flexible integrated circuits, unrealizable with silicon wafer, as small area circuits.

Now, description will be made on the sixth embodiment of the present invention.

Figure 9A:
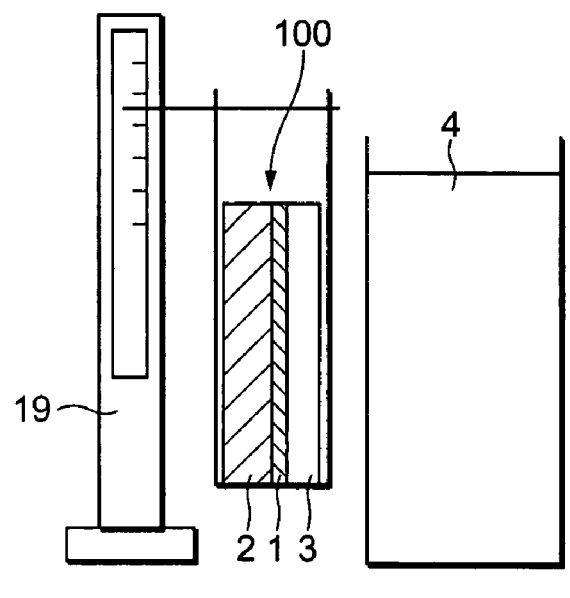
FIGS. 9A to 9C are the schematic sectional views illustrating a production method involved in a sixth embodiment of the present invention.
Figure 9B:
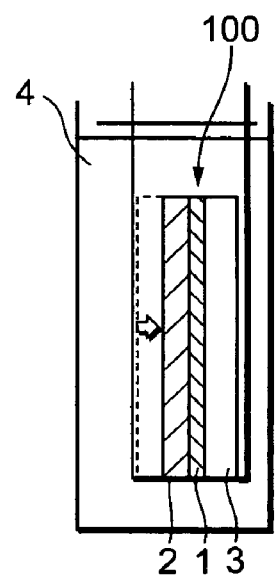
Figure 9C:
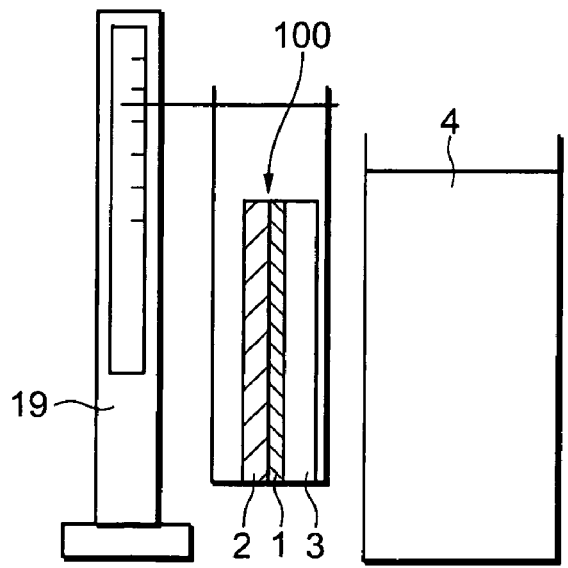

FIGS. 9A to 9C shows a production method of a flexible electronic device involved in the sixth embodiment. The present embodiment can provide a production method in which a flexible electronic device is produced in such a way that particularly the glass substrate is subjected to etching with high precision until a desired residual thickness is reached. At the beginning, as FIG. 9A shows, before starting etching, a weight measuring device 19 measures the weight of a device board 100 in which a thin film device 1 is formed on a glass substrate 2 and furthermore a protection film 3 is formed on the surface of the thin film device 1. Thereafter, as FIG. 9B shows, the device board 100 is soaked in an etching solution 4 and is subjected to etching for an appropriate period of time. After the etching for the appropriate period of time, as FIG. 9C shows, the board is taken out from the etching solution 4, and the weight of the board is once again measured. The sequence of steps shown in FIGS. 9A to 9C and monitoring of the etching rate permit producing the board in a desired thickness of the glass substrate larger than 0 μm and not larger than 200 μm under satisfactory control. The present production method is particularly effective when the glass substrates are different from each other in material and initial weight. Additionally, in the operations shown in FIG. 9A, the thickness of the glass substrate can be controlled with a further higher precision when at the beginning the device board 100 is soaked in the etching solution 4 for a few seconds and then taken out, and the initial weight of the device board 100 is measured under a condition such that the etching solution is adhered to the surface thereof.

Now, description will be made below on the seventh embodiment of the present invention.

Figure 10A:
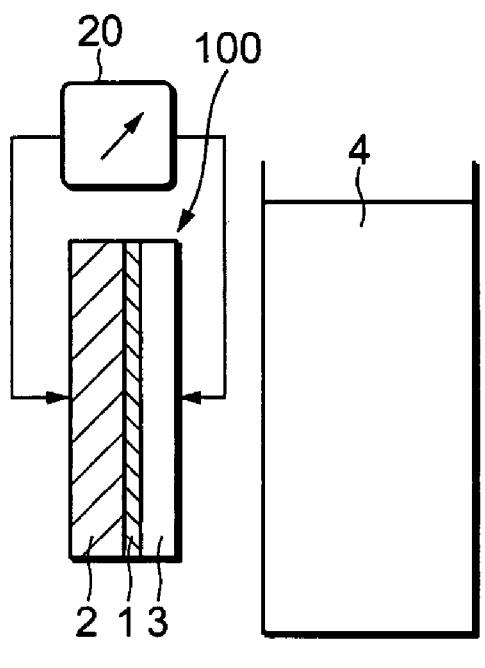
FIGS. 10A to 10C are the schematic sectional views illustrating a production method involved in a seventh embodiment of the present invention.
Figure 10B:
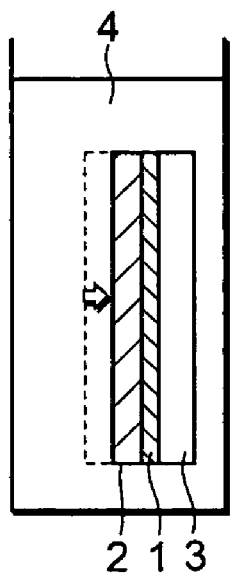
Figure 10C:
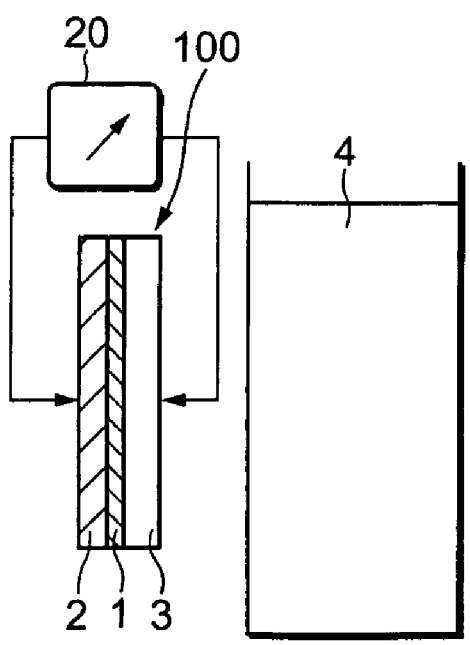

FIGS. 10A to 10C shows a production method of a flexible electronic device involved in the seventh embodiment, in particular, a production method in which a glass substrate is etched to a desired residual thickness with a high precision. At the beginning, as FIG. 10A shows, before starting etching, a length measuring device 20 measures the initial thickness of a device board 100 in which a thin film device 1 is formed on a glass substrate 2 and furthermore a protection film 3 is formed on the surface of the thin film device 1. Thereafter, as FIG. 10B shows, the device board 100 is soaked in an etching solution 4 and is subjected to etching for an appropriate period of time. After the etching for the appropriate period of time, as FIG. 10C shows, the board is taken out from the etching solution 4, and the thickness of the board is once again measured. The sequence of steps shown in FIGS. 10A to 10C and monitoring of the etching rate permit producing the board in a desired thickness of the glass substrate larger than 0 μm and not larger than 200 μm under satisfactory control. The present production method is particularly effective when the glass substrates are different from each other in material and initial thickness. Additionally, in the operations shown in FIG. 10A, the thickness of the glass substrate can be controlled with a further higher precision when at the beginning the device board 100 is soaked in the etching solution 4 for a few seconds and then taken out, and the initial thickness of the board is measured under a condition such that the etching solution 4 is adhered to the surface thereof.

As described above, according to the present invention, a flexible electronic device can be produced from a device board formed with one or a pair of substrates, by use of a transference method, under satisfactory control with low costs. Additionally, a flexible electronic device that is flexible and excellent in heat liberation characteristics can be actualized by transferring a thin film transistor array or the like formed on a glass substrate onto a high thermal conductivity film such as a copper film or the like. The flexible electronic device boards as described above can be made very thinner than conventional glass substrate based devices, which permits actualizing a system-in-package device in which flexible electronic devices are laminated to form a multilayer packaged structure systemized to display high functions.

What is claimed is:

1. A production method of a flexible display device comprising the steps of:
   forming a thin film device on a glass substrate;
   adhering a protection film onto said thin film device;
   etching said glass substrate from a back surface thereof after a step of said adhering said protection film such that residual thickness of said glass substrate is larger than 0 μm and not larger than 200 μm;
   adhering a flexible film onto said etched back surface of said glass substrate;
   wherein said flexible film comprises a highly thermally conductive film having a thermal conductivity higher than 0.01 W/cm·deg,
   wherein said flexible film is between 10 μm and 2 mm thick; and
   peeling said protection film from said thin film device after a step of said adhering said flexible film.

2. The production method for a flexible display device according to claim 1, wherein said thin film device is a thin film transistor formed of a silicon thin film.

3. The production method for a flexible display device according to claim 1, wherein said flexible film is an insulating film.

4. The production method for a flexible display device according to claim 1, wherein said flexible film is a laminated structure at least comprising a film having a thermal conductivity higher than 0.01 W/cm·deg and an insulating film.

5. A production method for a flexible electronic device, comprising:
   laminating a first glass substrate on which a first thin film device is formed and a second glass substrate on which a second thin film device is formed such that said first thin film device and said second thin film device are made facing each other;
   adhering a protection sheet on the surface of said first glass substrate other than said thin film device formed surface thereof;
   etching the surface of said second glass substrate other than said thin film device formed surface thereof until the residual thickness of said second glass substrate becomes larger than 0 μm and not larger than 200 μm;
   adhering a second flexible film onto said etched back surface of said second glass substrate;
   peeling said protection sheet; etching the surface of said first glass substrate other than said thin film device formed surface thereof after a step of said laminating until the residual thickness of said first glass substrate becomes larger than 0 μm and not larger than 200 μm; and
   adhering a first flexible film on to said etched back surface of said first glass substrate,
   wherein these steps are successively performed.

6. A production method for a flexible electronic device, comprising:
   laminating a first glass substrate on which a first thin film device is formed and a second glass substrate on which a second thin film device is formed such that said first thin film device and said second thin film device are made facing each other;
   etching the surfaces of said first glass substrate and said second glass substrate respectively other than said thin film device formed surfaces thereof after a step of said laminating until the respective residual thicknesses of said first glass substrate and said second glass substrate becomes larger than 0 μm and not larger than 200 μm; and
   adhering flexible films respectively onto said etched back surfaces of said first glass substrate and said second glass substrate,
   wherein these steps are performed successively.

7. The production method for a flexible electronic device according to claim 5, wherein said flexible electronic device is a liquid crystal display device.

8. The production method for a flexible electronic device according to claim 6, wherein said flexible electronic device is a liquid crystal display device.

9. The production method for a flexible electronic device according to claim 5, wherein at least one of said first flexible film and said second flexible film has at least one of a polarizing function and a phase difference function.

10. The production method for a flexible electronic device according to claim 6, wherein at least one of said flexible films has at least one of a polarizing function and a phase difference function.

11. The production method for a flexible display device according to claim 1, wherein in etching said glass substrate, said residual thickness of said glass substrate is confirmed by a method selected from
- a weight measurement with a weight measuring device for a structure consisting of said glass substrate, and said thin film device formed on said glass substrate and said protection film formed on said thin film device, and
- a thickness measurement with a length measuring device for a structure consisting of said glass substrate, said thin film device formed on said glass substrate and said thin film device formed on said first glass substrate and said second glass substrate and said protection film formed on said thin film device.

12. The production method for a flexible electronic device according to claim 5, wherein in etching said first glass substrate and said second glass substrate, said residual thickness of each of said first glass substrate and said second glass substrate is confirmed by a method selected from
- a weight measurement with a weight measuring device for a structure consisting of said first glass substrate and said second glass substrate, said thin film device formed on said first glass substrate and said second glass substrate and said protection film formed on said thin film device, and
- a thickness measurement with a length measuring device for a structure consisting of said first glass substrate and said second glass substrate and said thin film device formed on said first glass substrate and said second glass substrate and said protection film formed on said thin film device.

13. The production method of a flexible electronic device according to claim 6, wherein in etching said first glass substrate and said second glass substrate, said residual thickness of each of said first glass substrate and said second glass substrate is confirmed by a method selected from a weight measurement with a weight measuring device for a structure consisting of said first glass substrate and said second glass substrate, said thin film device formed on said first glass substrate and said second glass substrate and said protection film formed on said thin film layer, and a thickness measurement with a length measuring device for a structure consisting of said first glass substrate and said second glass substrate and said protection film formed on said thin film device.

* * * * *